United States Patent
Zu et al.

(10) Patent No.: US 9,666,544 B2
(45) Date of Patent: May 30, 2017

(54) PACKAGE SUBSTRATE DIFFERENTIAL IMPEDANCE OPTIMIZATION FOR 25 GBPS AND BEYOND

(71) Applicant: Sarcina Technology LLC, Palo Alto, CA (US)

(72) Inventors: Longqiang Zu, Palo Alto, CA (US); Li-Chang Hsiao, Miaoli County (TW)

(73) Assignee: SARCINA TECHNOLOGY LLC, Palo Alto, CA (US)

( * ) Notice: Subject to any disclaimer, the term of this patent is extended or adjusted under 35 U.S.C. 154(b) by 27 days.

(21) Appl. No.: 14/729,050

(22) Filed: Jun. 2, 2015

(65) Prior Publication Data
US 2016/0358866 A1 Dec. 8, 2016

(51) Int. Cl.
| | |
|---|---|
| *H01L 23/66* | (2006.01) |
| *G06F 17/50* | (2006.01) |
| *H01L 23/498* | (2006.01) |
| *H01L 23/538* | (2006.01) |

(52) U.S. Cl.
CPC .......... *H01L 23/66* (2013.01); *G06F 17/5031* (2013.01); *H01L 23/49816* (2013.01); *H01L 23/5383* (2013.01); *H01L 23/5384* (2013.01); *H01L 23/5386* (2013.01)

(58) Field of Classification Search
CPC ................. G06F 17/5031; H01L 23/66; H01L 23/49816; H01L 23/5383; H01L 23/5384; H01L 23/5386; H01L 2924/00; H01L 2924/0002; H01L 2924/00014; H01L 2924/16225; H01L 2924/48227; H01L 2924/32225; H01L 2924/73265; H05K 1/162
See application file for complete search history.

(56) References Cited

U.S. PATENT DOCUMENTS

| | | | |
|---|---|---|---|
| 7,271,681 B2 | 9/2007 | Dyckman et al. | |
| 7,531,751 B2 | 5/2009 | Hosomi et al. | |
| 7,781,889 B2 | 8/2010 | Leader et al. | |
| 8,119,931 B1 | 2/2012 | Liu | |
| 2006/0237222 A1* | 10/2006 | Hosomi | H01L 23/66 174/255 |
| 2007/0008049 A1 | 1/2007 | Dyckman et al. | |
| 2010/0232480 A1* | 9/2010 | Bhandal | H01L 23/642 375/219 |
| 2014/0252612 A1 | 9/2014 | Nakagawa | |

* cited by examiner

*Primary Examiner* — Fernando L Toledo
*Assistant Examiner* — Lawrence-Linh T Nguyen
(74) *Attorney, Agent, or Firm* — Chen Yoshimura LLP

(57) ABSTRACT

A package design method is disclosed for the optimization of package differential impedance at data rates of 25 Gb/s and beyond. The method optimizes the differential impedance of package vertical interconnections of BGA ball, via, and PTH as well as around the joint between the vertical interconnection and the horizontal interconnection of trace. At 8 ps rise time, a <5% impedance variation is obtained with a 0.8 mm BGA ball pitch and a 10-layer buildup substrate and a <10% impedance variation is obtained with a 1 mm BGA ball pitch and a 14-layer buildup substrate. The method is applicable to all BGA package designs running at 25 Gb/s and beyond.

15 Claims, 16 Drawing Sheets

Figure 3a

| Layer Stackup | Type | Material | Thickness (um) | Conductivity (S/m) | Dielectric Constant | Loss Tangent |
|---|---|---|---|---|---|---|
| SOLDER MASK-TOP | SURFACE | AIR | | | 1 | 0 |
| | DIELECTRIC | PSR-4000 AUS703 | 25 | | 3.8 | 0.026 |
| CU-1 | CONDUCTOR | COPPER | 15 | 59590000 | | |
| DRILL1-2 | DIELECTRIC | ABF-GX13 | 30 | 0 | 3.35 | 0.012 |
| CU-2 | CONDUCTOR | COPPER | 15 | 59590000 | | |
| DRILL2-3 | DIELECTRIC | ABF-GX13 | 30 | 0 | 3.35 | 0.012 |
| CU-3 | CONDUCTOR | COPPER | 15 | 59590000 | | |
| DRILL3-4 | DIELECTRIC | ABF-GX13 | 30 | 0 | 3.35 | 0.012 |
| CU-4 | CONDUCTOR | COPPER | 15 | 59590000 | | |
| DRILL4-5 | DIELECTRIC | ABF-GX13 | 30 | 0 | 3.35 | 0.012 |
| CU-5 | CONDUCTOR | COPPER | 23 | 59590000 | | |
| DRILL5-6 | DIELECTRIC | Hitachi MCLE700GR | 400 | 0 | 4.7 | 0.011 |
| CU-6 | CONDUCTOR | COPPER | 23 | 59590000 | | |
| DRILL6-7 | DIELECTRIC | ABF-GX13 | 30 | 0 | 3.35 | 0.012 |
| CU-7 | CONDUCTOR | COPPER | 15 | 59590000 | | |
| DRILL7-8 | DIELECTRIC | ABF-GX13 | 30 | 0 | 3.35 | 0.012 |
| CU-8 | CONDUCTOR | COPPER | 15 | 59590000 | | |
| DRILL8-9 | DIELECTRIC | ABF-GX13 | 30 | 0 | 3.35 | 0.012 |
| CU-9 | CONDUCTOR | COPPER | 15 | 59590000 | | |
| DRILL9-10 | DIELECTRIC | ABF-GX13 | 30 | 0 | 3.35 | 0.012 |
| CU-10 | CONDUCTOR | COPPER | 15 | 59590000 | | |
| SOLDER MASK-BOTTOM | DIELECTRIC | PSR-4000 AUS703 | 25 | | 3.8 | 0.026 |
| | SURFACE | AIR | | | 1 | 0 |

Figure 3b

| Layer Stackup | Type | Material | Thickness (um) | Conductivity (S/m) | Dielectric Constant | Loss Tangent |
|---|---|---|---|---|---|---|
| | SURFACE | AIR | | | 1 | 0 |
| SOLDER MASK-TOP | DIELECTRIC | PSR-4000 AUS703 | 25 | | 3.8 | 0.026 |
| CU-1 | CONDUCTOR | COPPER | 15 | 59590000 | | |
| DRILL1-2 | DIELECTRIC | ABF-GX13 | 33 | | 3.32 | 0.0175 |
| CU-2 | CONDUCTOR | COPPER | 15 | 59590000 | | |
| DRILL2-3 | DIELECTRIC | ABF-GX13 | 33 | | 3.32 | 0.0175 |
| CU-3 | CONDUCTOR | COPPER | 15 | 59590000 | | |
| DRILL3-4 | DIELECTRIC | ABF-GX13 | 33 | | 3.32 | 0.0175 |
| CU-4 | CONDUCTOR | COPPER | 15 | 59590000 | | |
| DRILL4-5 | DIELECTRIC | ABF-GX13 | 33 | | 3.32 | 0.0175 |
| CU-5 | CONDUCTOR | COPPER | 15 | 59590000 | | |
| DRILL5-6 | DIELECTRIC | ABF-GX13 | 33 | | 3.32 | 0.0175 |
| CU-6 | CONDUCTOR | COPPER | 15 | 59590000 | | |
| DRILL6-7 | DIELECTRIC | ABF-GX13 | 33 | | 3.32 | 0.0175 |
| CU-7 | CONDUCTOR | COPPER | 23 | 59590000 | | |
| DRILL7-8 | DIELECTRIC | Hitachi MCLE700GR | 800 | | 4.6 | 0.01 |
| CU-8 | CONDUCTOR | COPPER | 23 | 59590000 | | |
| DRILL8-9 | DIELECTRIC | ABF-GX13 | 33 | | 3.32 | 0.0175 |
| CU-9 | CONDUCTOR | COPPER | 15 | 59590000 | | |
| DRILL9-10 | DIELECTRIC | ABF-GX13 | 33 | | 3.32 | 0.0175 |
| CU-10 | CONDUCTOR | COPPER | 15 | 59590000 | | |
| DRILL10-11 | DIELECTRIC | ABF-GX13 | 33 | | 3.32 | 0.0175 |
| CU-11 | CONDUCTOR | COPPER | 15 | 59590000 | | |
| DRILL11-12 | DIELECTRIC | ABF-GX13 | 33 | | 3.32 | 0.0175 |
| CU-12 | CONDUCTOR | COPPER | 15 | 59590000 | | |
| DRILL12-13 | DIELECTRIC | ABF-GX13 | 33 | | 3.32 | 0.0175 |
| CU-13 | CONDUCTOR | COPPER | 15 | 59590000 | | |
| DRILL13-14 | DIELECTRIC | ABF-GX13 | 33 | | 3.32 | 0.0175 |
| CU-14 | CONDUCTOR | COPPER | 15 | 59590000 | | |
| SOLDER MASK-BOTTOM | DIELECTRIC | PSR-4000 AUS703 | 25 | | 3.8 | 0.026 |
| | SURFACE | AIR | | | 1 | 0 |

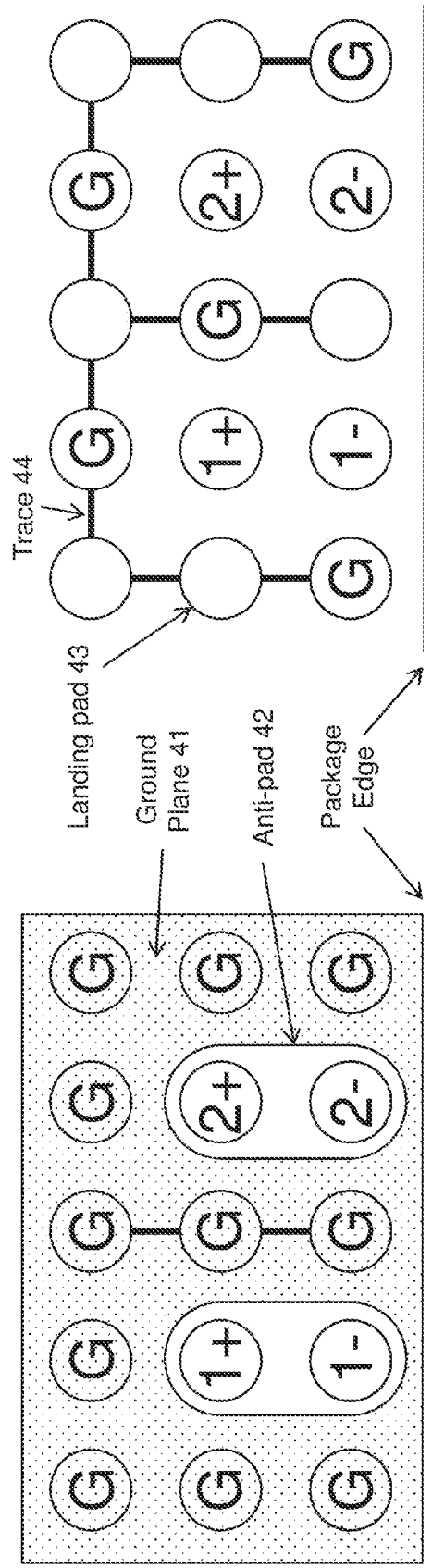

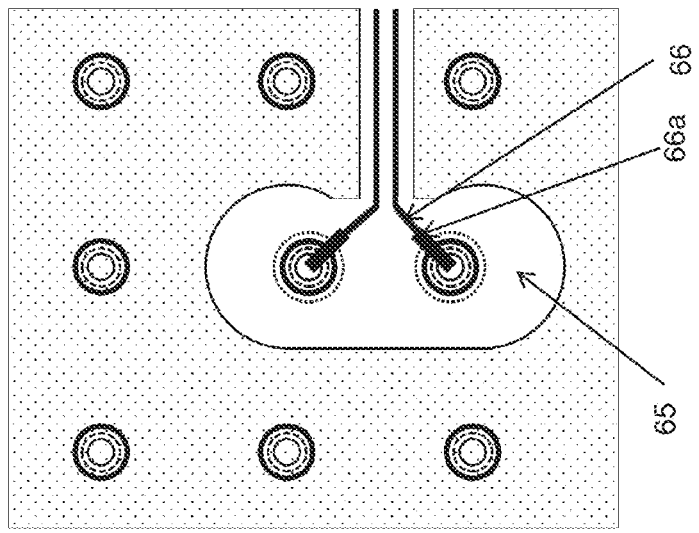
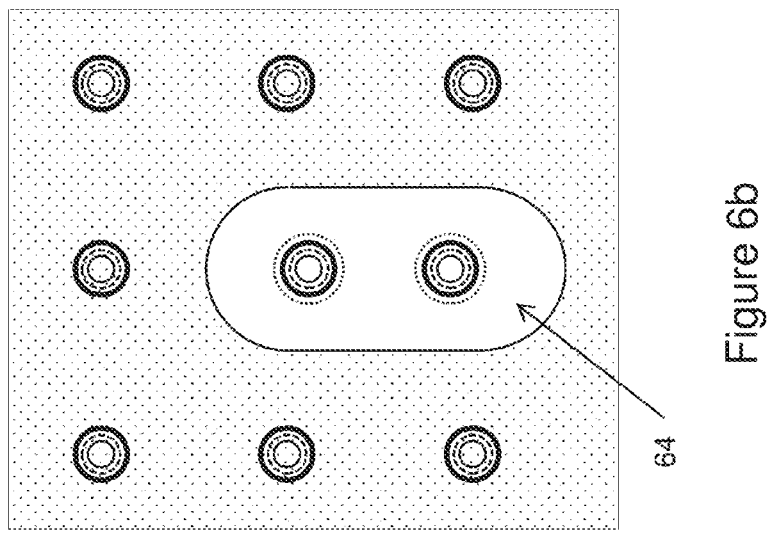
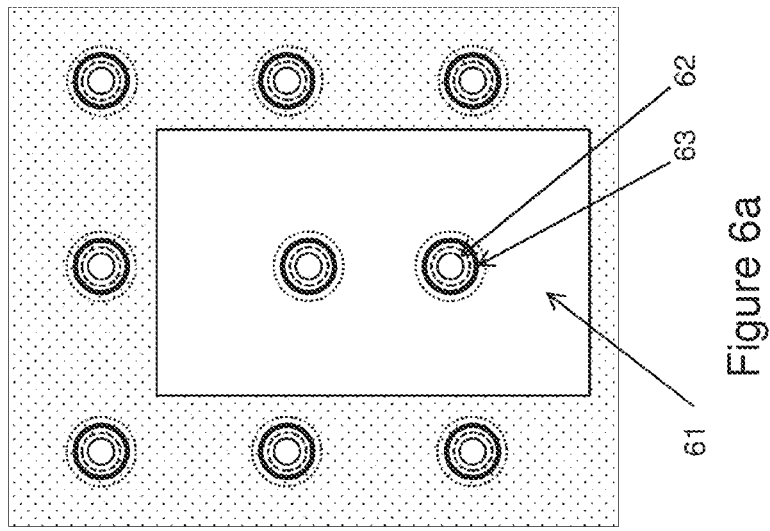

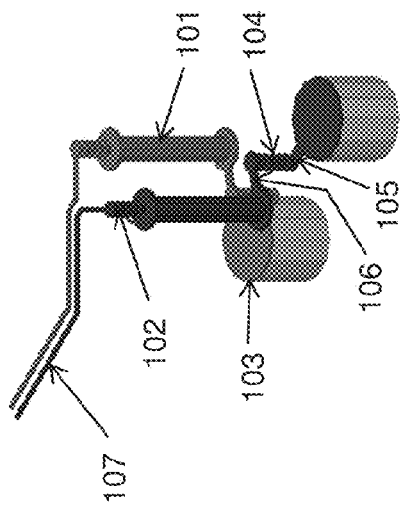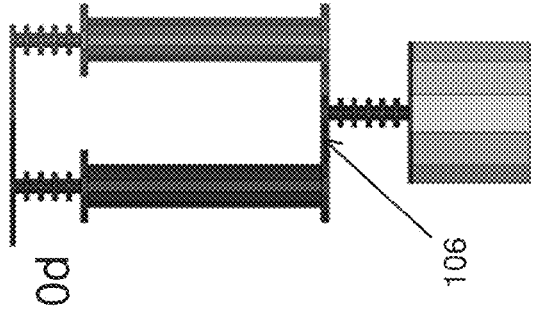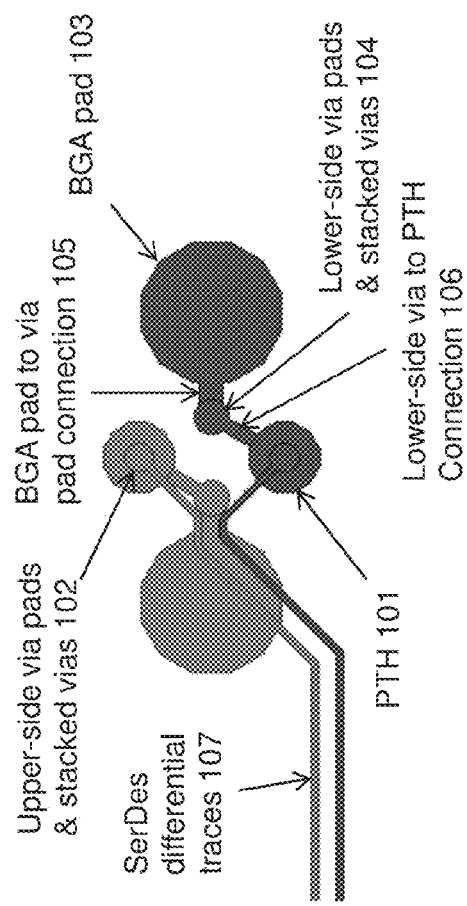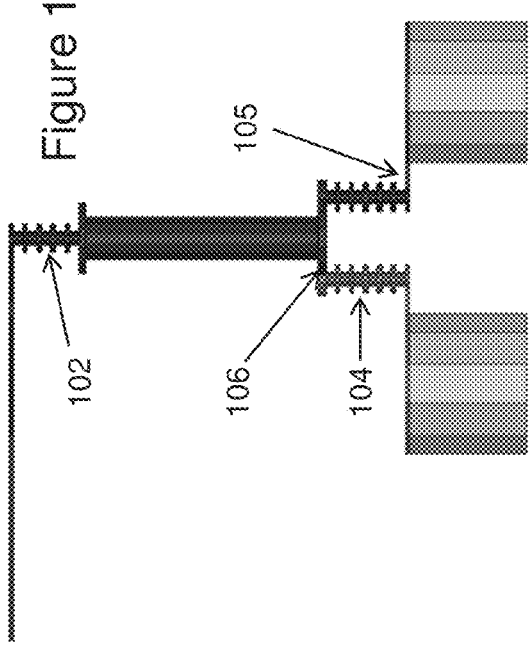

Figure 11

| Parameters | 1 | 2 |
|---|---|---|
| BGA ball pitch (mm) | 0.8 | 1.0 |
| BGA ball height after reflow (mm) | 0.35 | 0.4 |
| BGA ball diameter after reflow (mm) | 0.4 | 0.5 |
| BGA ball pad diameter (mm) | 0.5 | 0.5 |
| Via diameter (um) | 60 | 60 |
| Via pad diameter (um) | 100 | 100 |
| Via pitch below PTH (um) | 550 | 280 |
| PTH diameter (um) | 150 | 150 |
| PTH pad diameter (um) | 300 | 300 |
| PTH pitch (um) | 550 | 500 |
| Via pitch above PTH (um) | 550 | 500 |
| Bump height after reflow (um) | 85 | 85 |
| Bump width after reflow (um) | 85 | 85 |

# PACKAGE SUBSTRATE DIFFERENTIAL IMPEDANCE OPTIMIZATION FOR 25 GBPS AND BEYOND

BACKGROUND OF THE INVENTION

Field of the Invention

This invention relates to semiconductor chip package design for high speed SerDes signals which achieves low substrate differential impedance discontinuity from BGA balls to C4 bumps. It also provides an optimization method for calculating parameters of such a package.

Description of the Related Art and Background

To meet the increasing demand for high speed chip-to-chip communication, today's advanced semiconductor chips require high speed SerDes (Serializer/Deserializer) interconnections. The leading edge SerDes data rate has increased from 10 Gb/s to 25-28 Gb/s. SerDes differential impedance discontinuity in a package substrate is a key parameter in determining SerDes eye diagram quality. A high impedance mismatch along the path from ball grid array (BGA) ball to C4 bump will create large signal reflections and degrade signal quality and as a result, reduce eye opening. Unfortunately, in a semiconductor package the impedance mismatch is a natural outcome because of different structures: BGA ball, via, PTH (plated-through-hole), trace, and C4 bump. They are required to accomplish electrical interconnection in a robust mechanical enclosure. Usually each structure has a different characteristic impedance. Connecting them together will naturally create impedance mismatch. If the impedance discontinuity of a SerDes signal could be reduced, the eye diagram at the receiver end could be opened wider. A widely opened eye diagram allows two SerDes chips to be placed at a greater distance away from each other on a PCB. If a cable is used in the communication between two SerDes chips placed on two different PCBs, then a longer cable could be deployed, benefiting from an improved eye diagram. A good eye diagram also reduces the bit error rate in data transmission.

The increase in substrate impedance variation at 25 Gb/s and beyond has become a major concern in SerDes signal communication. At 10 Gb/s data rate, the rise time is roughly 20 ps. It is relatively easy to control the package substrate differential impedance to be less than ±10% of its designed value. A commonly used method is to enlarge the antipad size for BGA ball pad, via pad, and PTH pad. An antipad is a clear area around a feature or landing pad where the metal ground plane is removed. However, at >25 Gb/s data rate, these simple methods are no longer effective to meet the desired requirement of less than ±10% differential impedance variation from BGA ball to C4 bump.

FIG. 1 depicts a substrate cross section of a flip-chip BGA package. SerDes signals from silicon die bumps (C4 bumps) 11 are transmitted to BGA balls 20 through front-side vias 14, differential traces 13, PTHs 16, and back-side vias 18. For a good package design that has a differential impedance discontinuity of less than ±10% at 10 Gb/s data rate, the impedance variation for the same package design should be close to 30% when running signals at 25 Gb/s. Here the fast edge rate of signal switching due to reduced rise time makes the signal impedance more sensitive to package discontinuity.

Package horizontal interconnection for a SerDes differential signal is achieved by routing two traces in parallel in a metal layer. It is well known that by properly controlling the trace width and spacing of the two traces, it is possible to obtain desired differential trace impedance of about 100 Ohms. However, for a vertical interconnection, maintaining a 100-Ohm differential impedance from BGA ball to C4 bump (including vias and PTHs) is difficult because their diameters and heights, as well as spacing, are different from each other. This makes their differential impedance different too. FIG. 2 is a TDR (Time Domain Reflectometry) plot showing a SerDes signal differential impedance discontinuity inside a package and enlargement due to reduced rise time. Different package structures, BGA ball, via, PTH, trace and C4 bump, have different impedances. The TDR plot shows the substrate impedance discontinuity from BGA ball to via/PTH and then from trace to C4 bump. At 10 Gb/s data rate (dash-dotted line), the rise time is about 20 ps and the differential impedance mismatch can be controlled within 10%. However, for the same design at 25 Gb/s data rate (solid line), the rise time is about 8 ps and the differential impedance mismatch could be close to 30% and range from 70 Ohms to 130 Ohms. In other words, the impedance mismatch increases with the increase of data rate. Because of the large impedance mismatch and the vast amount of signal reflection, vertical differential impedance optimization to lower the variation becomes difficult. In addition, each vertical interconnection, BGA ball, via, and PTH has a slightly larger landing pad (landing pads are shown in FIG. 1 as bump landing pad 12, via landing pad 15, PTH landing pad 17, and ball landing pad 19). Its function is to ensure the manufacture tolerance of the drill alignment for via. The PTH in substrate manufacture is considered and the BGA ball attachment tolerance in assembly process is taken into account. All these tolerances make the adjacent interconnections solid. But the various landing pads from layer to layer make the impedance even more difficult to control. Furthermore, there are horizontal metal planes from each layer surrounding the vertical interconnections. Their impact on the differential impedance of a vertical SerDes signal cannot be neglected. Finally, the transition from vertical interconnection to horizontal interconnection imposes a challenge to package design because matching the impedance at the transition point is not easy.

SUMMARY OF THE INVENTION

To overcome the above-discussed problems, special designs in BGA ball assignment, via and PTH placement, metal void and shielding balance, and trace width adjustment near the transition location are provided. In the meantime, the design can meet high volume manufacturing design rules and can pass rigorous quality and reliability tests.

In one aspect, the invention is directed to a semiconductor chip package for high speed SerDes signals, which includes: a plurality of substrate layers stacked on each other, including a top layer, a first subset of multiple layers stacked on each other and below the top layer, a second subset of one or more layers stacked on each other and below the first subset, and a third subset of multiple layers stacked on each other and below the second subset, wherein each of the first subset of multiple layers includes at least first and second front-side vias adjacent each other, the first front-side vias of the multiple layers being stacked and centered with each other to form a first front-side via stack, and the second front-side vias of the multiple layers being stacked and centered with each other to form a second front-side via stack, wherein the first and second front-side via stacks are separated by a predetermined first distance, wherein each of the second subset of one or more layers includes at least first and second plated-through-holes (PTHs) adjacent each other, the first PTHs of the one or more layers being stacked and centered with each other to form a first PTH stack and the second PTHs of the one or more layers being stacked and centered with each other to form a second PTH stack, wherein the first and second PTH stacks are separated by a predetermined second distance, wherein each of the third subset of multiple layers includes at least first and second back-side vias adjacent each other, the first back-side vias of the multiple layers being stacked and centered with each other to form a first back-side via stack, and the second back-side vias of the multiple layers being stacked and centered with each other to form a second back-side via stack, wherein the first and second back-side via stacks are separated by a predetermined third distance, wherein either the first front-side via stack or the first back-side via stack or both are stacked and centered with the first PTH stack, and either the second front-side via stack or the second back-side via stack or both are stacked and centered with the second PTH stack, wherein the top layer includes first and second vias, wherein a top one of the first subset of layers includes at least first and second metal traces respectively connecting the first and second vias of the top layer with the first and second vias of the top one of the first subset of layers, the first and second metal traces each including an initial segment respectively leading from the first and second vias of the top one of the first subset of layers, the initial segments having a predetermined length and a predetermined width which is different from a width of remaining portions of the first and second metal traces; wherein each of the top one and a second one of the first subset of layers has a metal ground plane with an antipad around the first and second vias, wherein each of remaining ones of the first subset of multiple layers has a metal ground plane with a ground void around the first and second vias having a size greater than that of the antipad, and wherein each of the third subset of multiple layers is free of a metal ground plane; at least a first and a second silicon die bumps (C4 bumps) formed on the top layer and connected to the first and second vias of the top layer, for flip-chip mounting a semiconductor chip; a plurality of ball grid array (BGA) ball landing pads formed on a bottom side of a bottom one of the third subset of multiple layers, the BGA ball landing pads forming a grid; and at least a first and a second BGA balls formed on two of the BGA ball landing pads and connected to the first and second back-side via stacks, wherein the first BGA ball, the first back-side via stack, the first PTH stack, the first front-side via stack, the first metal trace, the first via of the top layer, and the first C4 bump are electrically connected together, and wherein the second back-side via stack, the second PTH stack, the second front-side via stack, the second metal trace, the second via of the top layer, and the second C4 bump are electrically connected together, wherein a SerDes signal differential impedance from the first and second BGA balls to the corresponding first and second C4 bumps has a variation of less than 10% in a time domain for a signal with a 25 Gb/s or higher data rate.

In another aspect, the present invention is directed to an optimization method for a semiconductor chip package for high speed SerDes signals, the package including: a plurality of substrate layers stacked on each other, including a top layer, a first subset of multiple layers stacked on each other and below the top layer, a second subset of one or more layers stacked on each other and below the first subset, and a third subset of multiple layers stacked on each other and below the second subset, wherein each of the first subset of multiple layers includes at least first and second front-side vias adjacent each other, the first front-side vias of the multiple layers being stacked and centered with each other to form a first front-side via stack, and the second front-side vias of the multiple layers being stacked and centered with each other to form a second front-side via stack, wherein the first and second front-side via stacks are separated by a first distance, wherein each of the second subset of one or more layers includes at least first and second plated-through-holes (PTHs) adjacent each other, the first PTHs of the one or more layers being stacked and centered with each other to form a first PTH stack and the second PTHs of the one or more layers being stacked and centered with each other to form a second PTH stack, wherein the first and second PTH stacks are separated by a second distance, wherein each of the third subset of multiple layers includes at least first and second back-side vias adjacent each other, the first back-side vias of the multiple layers being stacked and centered with each other to form a first back-side via stack, and the second back-side vias of the multiple layers being stacked and centered with each other to form a second back-side via stack, wherein the first and second back-side via stacks are separated by a third distance, wherein the top layer includes first and second vias, wherein a top one of the first subset of layers includes at least first and second metal traces respectively connecting the first and second vias of the top layer with the first and second vias of the top one of the first subset of layers, the first and second metal traces each including an initial segment respectively leading from the first and second vias of the top one of the first subset of layers, the initial segments having a length and a width which is different from a width of remaining portions of the first and second metal traces; wherein each of the top one and a second one of the first subset of layers has a metal ground plane with an antipad around the first and second vias, wherein each of remaining ones of the first subset of multiple layers has a metal ground plane with a ground void around the first and second vias, and wherein each of the third subset of multiple layers is free of a metal ground plane; at least a first and a second silicon die bumps (C4 bumps) formed on the top layer and connected to the first and second vias of the top layer, for flip-chip mounting a semiconductor chip; a plurality of ball grid array (BGA) ball landing pads formed on a bottom side of a bottom one of the third subset of multiple layers, the BGA ball landing pads forming a grid; and at least a first and a second BGA balls formed on two of the BGA ball landing pads and connected to the first and second back-side via stacks, wherein the first BGA ball, the first back-side via stack, the first PTH stack, the first front-side via stack, the first metal trace, the first via of the top layer, and the first C4 bump are electrically connected together, and wherein the second back-side via stack, the second PTH stack, the second front-side via stack, the second metal trace, the second via of the top layer, and the second C4 bump are electrically connected together, the optimization method including: defining package design parameters including package substrate layer count, thickness and electrical properties of each substrate layer, metal layer thickness on each substrate layer, BGA ball height and diameter after reflow, BGA ball landing pad spacing, assignment and pattern of BGA ball on BGA ball landing pads, C4 bump height and diameter after reflow, C4 bump spacing, and assignment and pattern of C4 bumps on the top layer; defining a 3D full-wave electromagnetic simulation model for SerDes differential impedance from the first and second BGA balls to the respective first and second C4 bumps based on the package design parameters and a plurality of optimization parameters, the plurality of optimization parameters including: the first distance between the first and second front-side via stacks, the second distance between the first and second PTH stacks, the third distance between the first and second back-side via stacks, the lengths and widths of the initial segments of the first and second metal traces, and sizes of the ground voids in the metal ground planes of the remaining ones of the first subset of multiple layers; setting initial values for the plurality of optimization parameters; calculating the SerDes differential impedance in a time domain using the simulation model, the package design parameters and the plurality of optimization parameters with their initial values; and if the calculated SerDes differential impedance in the time domain has a variation greater than a predetermined percentage, adjusting the optimization parameters, and re-calculating the SerDes differential impedance using the simulation model, the package design parameters and the plurality of optimization parameters with their adjusted values.

BRIEF DESCRIPTION OF THE DRAWINGS

FIG. 3a is a table showing the package substrate cross section used in a first embodiment of the present invention, a 10 layer organic buildup substrate.

FIG. 3b is a table showing the package substrate cross section used in a first embodiment of the present invention, a 14 layer organic buildup substrate.

FIG. 4a schematically illustrates the BGA ball and the bottom layer design of a conventional package design.

FIG. 4b schematically illustrates the BGA ball and the bottom layer design of the first embodiment of the present invention.

FIGS. 6a-6c schematically illustrate the substrate design from layer 5 to layer 2 in the first embodiment.

FIGS. 10a-10d schematically illustrate the SerDes differential pair design in a second embodiment of the present invention that carries a BGA ball pitch of 1 mm.

FIG. 11 is a table showing a comparison of package layout parameters between the first embodiment and the second embodiment.

DETAILED DESCRIPTION OF THE PREFERRED EMBODIMENTS

Figure 1:
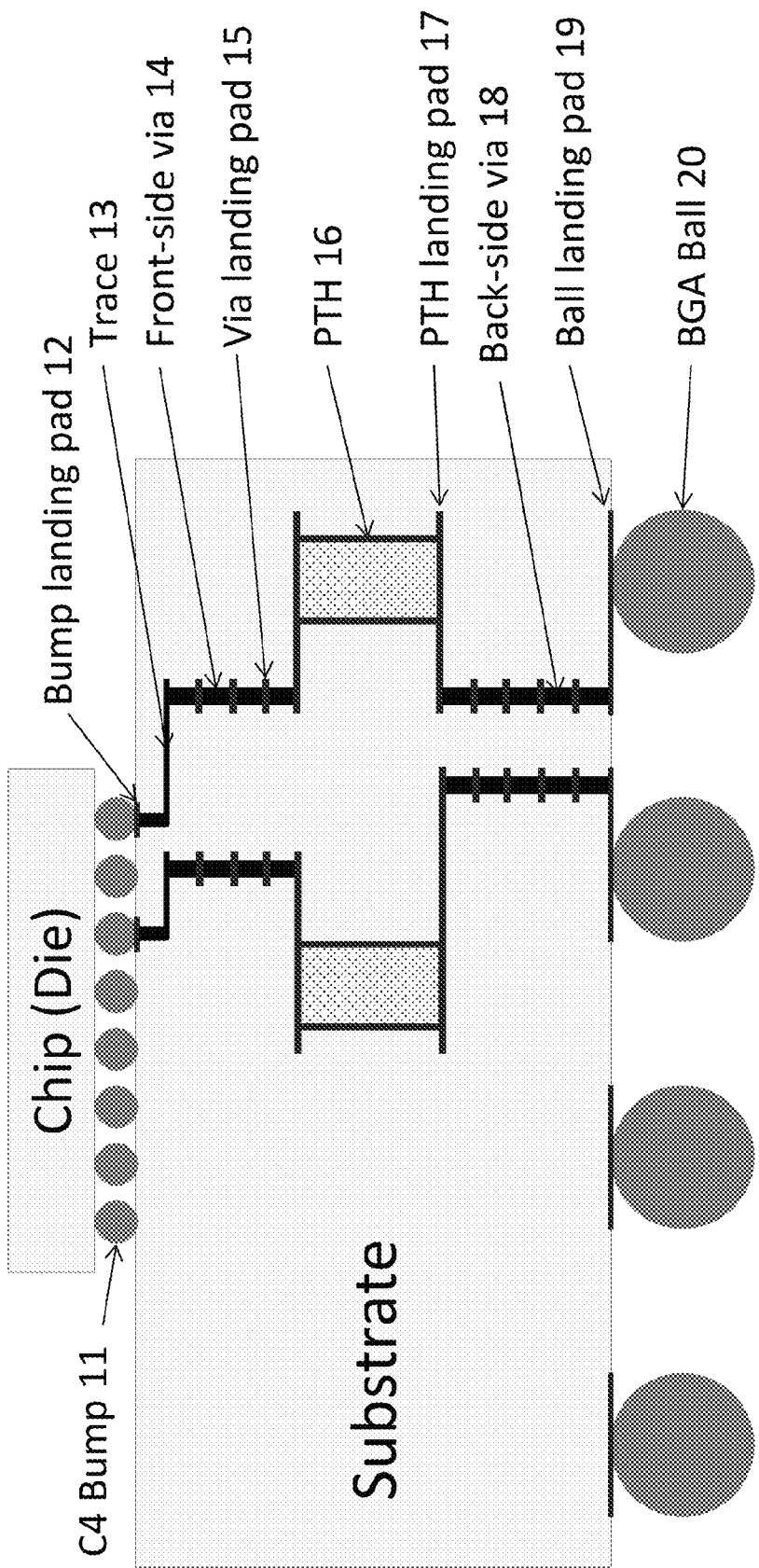
FIG. 1 schematically illustrates a cross-sectional view of a conventional flip-chip package.
Figure 2:
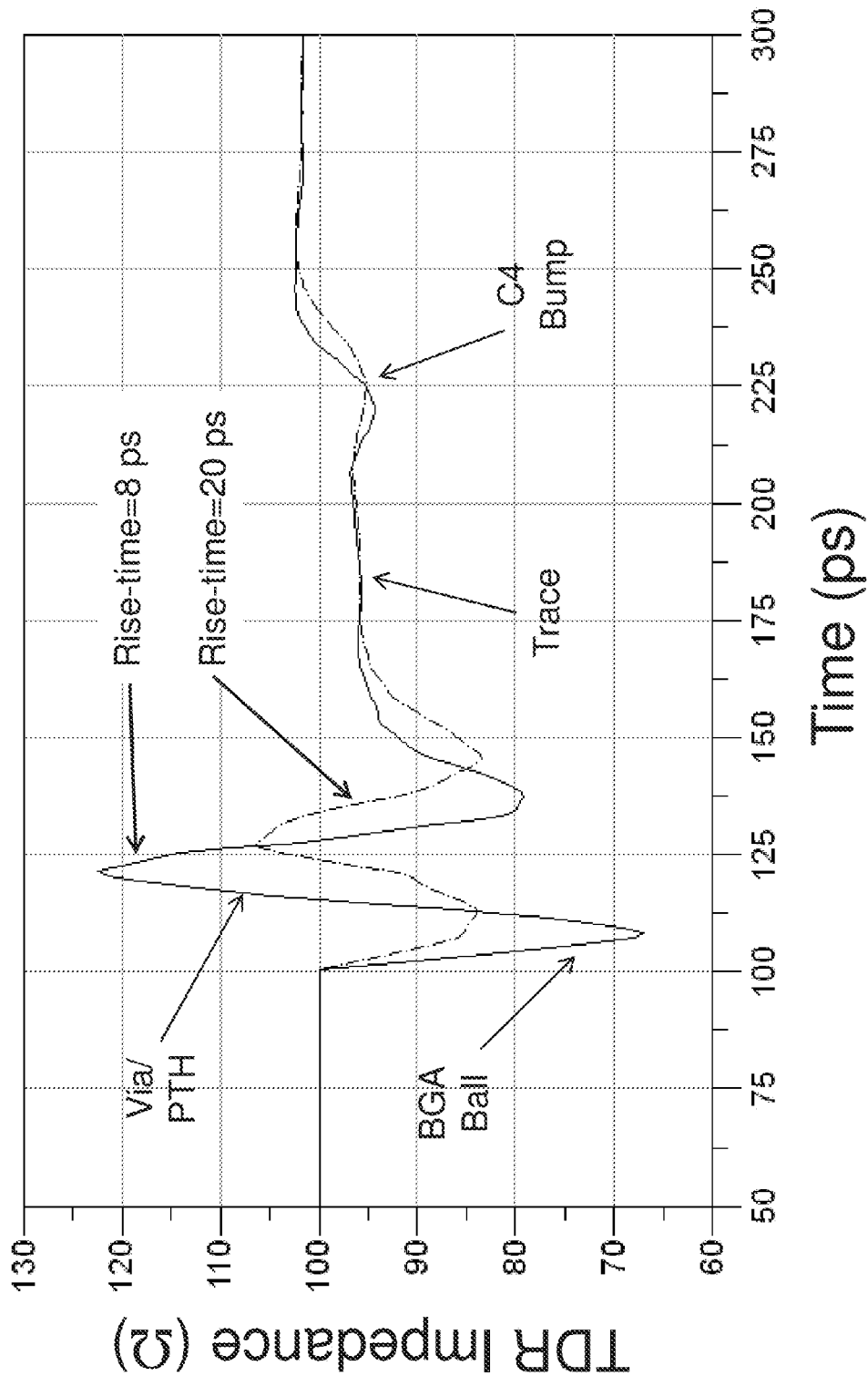
FIG. 2 illustrates package vertical interconnection's differential impedance discontinuity for the conventional flip-chip package and the significant rise of impedance variation when SerDes signal speed is increased from 10 Gb/s to 25 Gb/s and the signal rise time is reduced from 20 ps to 8 ps.

Today's semiconductor chip with high speed SerDes usually uses HFCBGA (Heat spreader Flip-Chip Ball-Grid-Array) package as its preferred package type. Due to the large I/O pin count and the associated large power and ground pins, these package body sizes tend to be large. Most of the time a 0.8 mm BGA ball pitch or a 1 mm BGA ball pitch is used to reduce large package warpage impact on PCB assembly and to leave enough space for PCB trace fan-out. Because of the large quantities of I/Os, these HFCBGA packages tend to have more than 6 metal layers in their substrate.

The present disclosure uses two typical cases to show that package differential impedance discontinuity can be reduced to <10% even when the signal rise time is <10 ps and the SerDes data rate is >25 Gb/s. A first embodiment of the embodiment uses a 10-layer HFCBGA package with a 0.8 mm BGA ball pitch and a 400 µm core. The package substrate has 4 buildup metal layers above a 2-layer laminate core substrate and another 4 buildup metal layers below the 2-layer laminate core substrate. This structure is typically called a 4-2-4 layer stackup. Core thickness is 400 µm. A second embodiment uses a 12-layer HFCBGA package with a 1 mm BGA ball pitch. Because of the increased pitch, the package body size may be enlarged. To prevent package warpage an 800 µm core is used. Another difference between the packages in the first and second embodiment is that the substrate vendors are different. As a result, the buildup dielectric layer thickness is increased from 30 µm in the first embodiment to 33 µm in the second embodiment and the electrical parameters for dielectric constant and loss tangent were slightly different. The structure of the second package is typically called a 6-2-6 layer stackup. Package design parameters provided in these two typical packages may be applied to other HFCBGA packages or used as the initial parameters for fine tuning.

The tables in FIGS. 3a and 3b show the substrate cross sections of the first example and the second example, respectively. Information on layer stackup and material electrical properties such as material name, layer thickness, and electrical parameters of copper conductivity, dielectric constant and loss tangent are listed. For the same material, electrical parameters of dielectric constant and loss tangent are slightly different between the two embodiments because different substrate suppliers provided different values. The two layer stackups are compliant with RoHS-6 (Restriction of Use of Hazardous Substances) requirements and have been widely used in the industry. The material names provided in the two tables are examples for explanation. Other materials may be used. In particular, with the advancement of the substrate material technology, they could be replaced with other better materials. For example, the buildup layer material ABF-GX13 could be replaced with ABF-GZ41 or ABF-GXE5. Their CTEs (Coefficient of Thermal Expansion) are closer to the CTE of the core layer material. This reduces stress when multiple vias are stacked above and/or below a PTH.

FIG. 4b shows the design of the BGA ball and the bottom metal layer of the first embodiment of this invention. FIG. 4a shows the BGA ball and the bottom metal layer of a conventional 10 Gb/s design. In FIGS. 4a and 4b, the letter "G" indicates ground balls under the anti-pad. As shown in FIG. 4a, in the conventional design a SerDes differential pair is surrounded with fully populated ground BGA balls. The metal ground plane 41 covers all the SerDes areas and has all the ground BGA balls connected except in the antipad region 42. It relies on enlarging the antipad 42 size to optimize impedance by reducing the parasitic capacitance between the BGA ball and the ground plane. The shielding is not in the signal vertical propagation direction and their contribution to crosstalk reduction between adjacent SerDes signals is minimal. On the other hand, it dramatically reduces the impedance because of the large capacitive coupling between it and the SerDes signals.

The first embodiment of the present invention, shown in FIG. 4b, provides a practical solution to resolve this issue. In the illustrated region, a majority—6 out of 11—of ground BGA ball sites surrounding the SerDes differential signals are not populated with BGA balls. This situation can be easily achieved by covering their BGA ball landing pads with solder resist. There is no ground plane. Adjacent ground BGA ball landing pads are connected via 50 μm wide traces 44. In FIG. 4b, the circles without the letter "G" indicate that there is no ground ball under the landing pads 43. This design is good enough to have <5% impedance variation in one example. To further reduce parasitic capacitive coupling, more ground BGA balls sites can be de-populated, or some of the unused BGA ball landing pads may be eliminated. These options can be used as a way to adjust the coupling between the SerDes signal and the ground and therefore to optimize each individual design. In one example, the BGA ball height is 350 μm and the BGA ball diameter is 400 μm after reflow. The BGA ball landing pad diameter is 500 μm. Because the BGA ball has a large capacitance and it brings down the BGA ball impedance, the minimum allowable BGA ball height and diameter are used in assembly for a 0.8 mm ball pitch.

Figure 5:
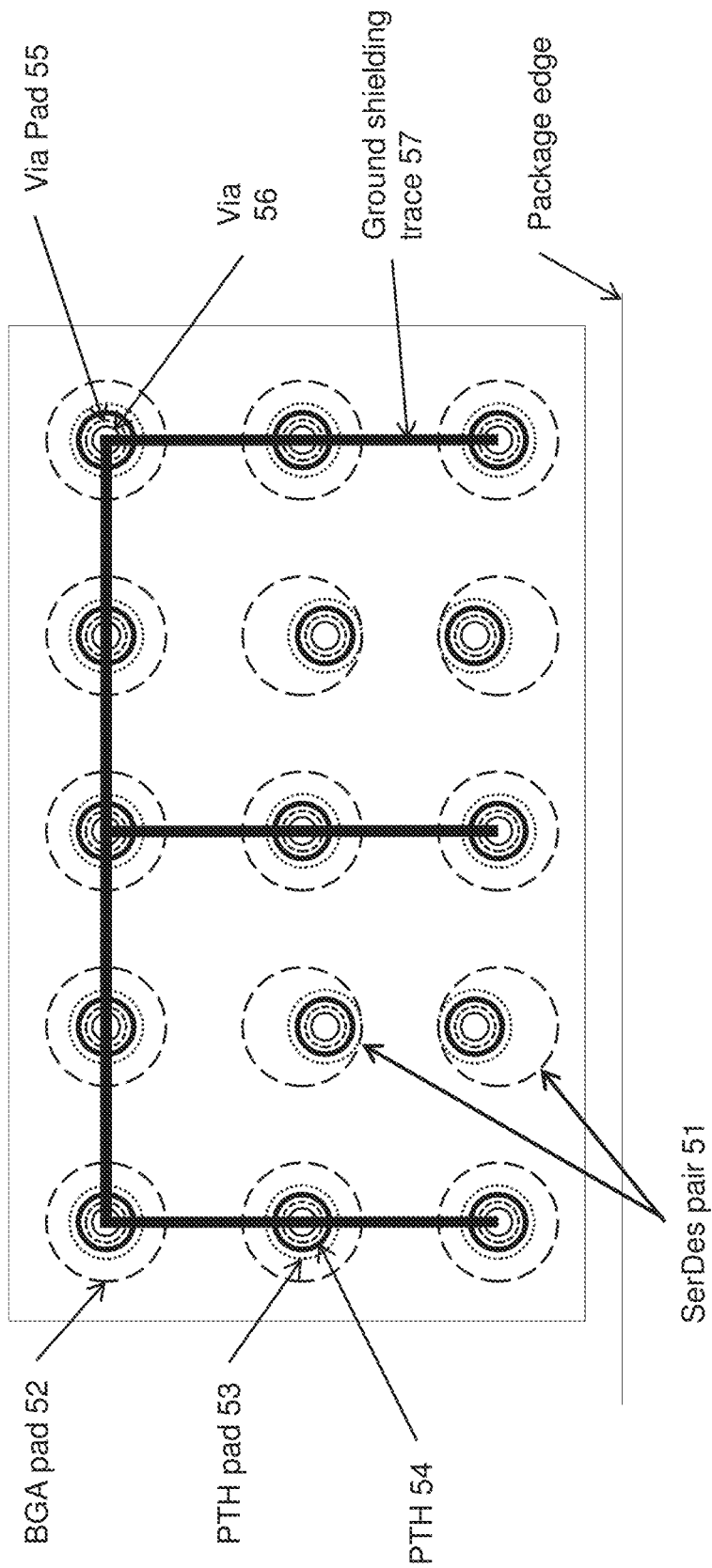
FIG. 5 schematically illustrates the substrate design from layer 10 to layer 6 in the first embodiment.

FIG. 5 is the top view of the substrate layout from layer 10 to layer 6 for the first embodiment. Shown in FIG. 5 are two SerDes pairs 51. They are surrounded by eleven BGA landing pads of ground. The largest dotted circle corresponds to the BGA landing pad 52 with a diameter of 500 μm. The middle dotted circle with a diameter of 300 μm and the thick solid circle with a diameter of 150 μm correspond to the PTH landing pad 53 and the PTH 54 respectively. The smallest dotted circle with a diameter of 100 μm and the smallest solid circle with a diameter of 60 μm correspond to via landing pad 55 and via 56 respectively. (Note that the drawings of these circles are not to scale.) Above each BGA pad, the interconnection vias and their PTH are all stacked and centered (i.e. their centers are aligned with each other). For each SerDes pair the PTH and via spacing is adjusted to 550 μm center to center to achieve <5% differential impedance variation. In other words, the PTH and via spacing for the SerDes pair is substantially smaller than the BGA ball pitch (0.8 mm for the first embodiment). As discussed in more detail later, tis distance is used as a parameter to optimize differential impedance. There is no ground plane, and adjacent ground vias are connected via ground shielding traces 57.

FIGS. 6a-6c show the layout from layer 5 to layer 2 for the first embodiment. As shown in FIG. 6a, the layouts for layer 5 and layer 4 are the same. On each layer a large part 61 of the ground area is removed (referred to as "ground void" in this disclosure), which helps to reduce capacitive coupling between the ground and the SerDes signals and raise the differential impedance. The amount of ground area to be removed on each layer and the shape of the removed area can be determined by 3D modeling and TDR analysis. In the illustrated embodiment the removed area (ground void) is a rectangular shape on each layer. Its width and height are 1100 μm and 1800 μm respectively. The SerDes vias 62 are stacked and centered with their respective PTH 63. Their vias' pitch is still kept at 550 μm.

FIG. 6b shows the layout for layer 3 in the first embodiment. Because there are SerDes differential traces on layer 2, the size of the removed portion 64 of the ground area on layer 3 is reduced to keep a stripline structure. The removed portion 64 has the shape of a typical antipad, with a width of 700 μm and a height of 1500 μm. SerDes via pitch still remains at 550 μm and the vias and PTH are stacked and centered.

Layer 2 layout is shown in FIG. 6c. The ground antipad 65 is similar to that in layer 3 in size and shape. The vias of the SerDes pair are stacked and centered with their respective PTHs and the via pitch is 550 um. For the two fan-out traces 66, their initial segments 66a which lead from the via landing pad outwardly are wider than the rest of the differential traces. The length and the width of these initial segments 66a can be used as parameters to optimize the overall TDR impedance for a smooth impedance transition from the vertical via to the horizontal trace.

Layer 1 has a solid ground plane. Together with ground plane of layer 3 they form a good stripline structure for SerDes differential traces to be routed on layer 2. Because of space constraints at the present, SerDes signals at C4 bumps are connected to the differential traces through direct via drop down right underneath each C4 bump. It should be noted that in most conventional designs too much ground is typically placed surrounding a SerDes pair, leading to a sudden drop of differential impedance. In embodiments of the present invention, an enlarged ground void is used which usually helpful to lower the sudden reduction in impedance. The impact of a larger ground void on crosstalk is minimal.

It should be noted that the via and PTH design of embodiments of the present invention meets the high volume manufacture (HVM) design rules from the substrate vendor. Although the design is not explicitly written in current design rule as allowable, it has been confirmed with two leading substrate vendors that the there are no issues with the design under an HVM environment. Meanwhile, the selection of the smaller height and diameter of the BGA ball after reflow can be met in high volume manufacturing at assembly house.

Figure 7:
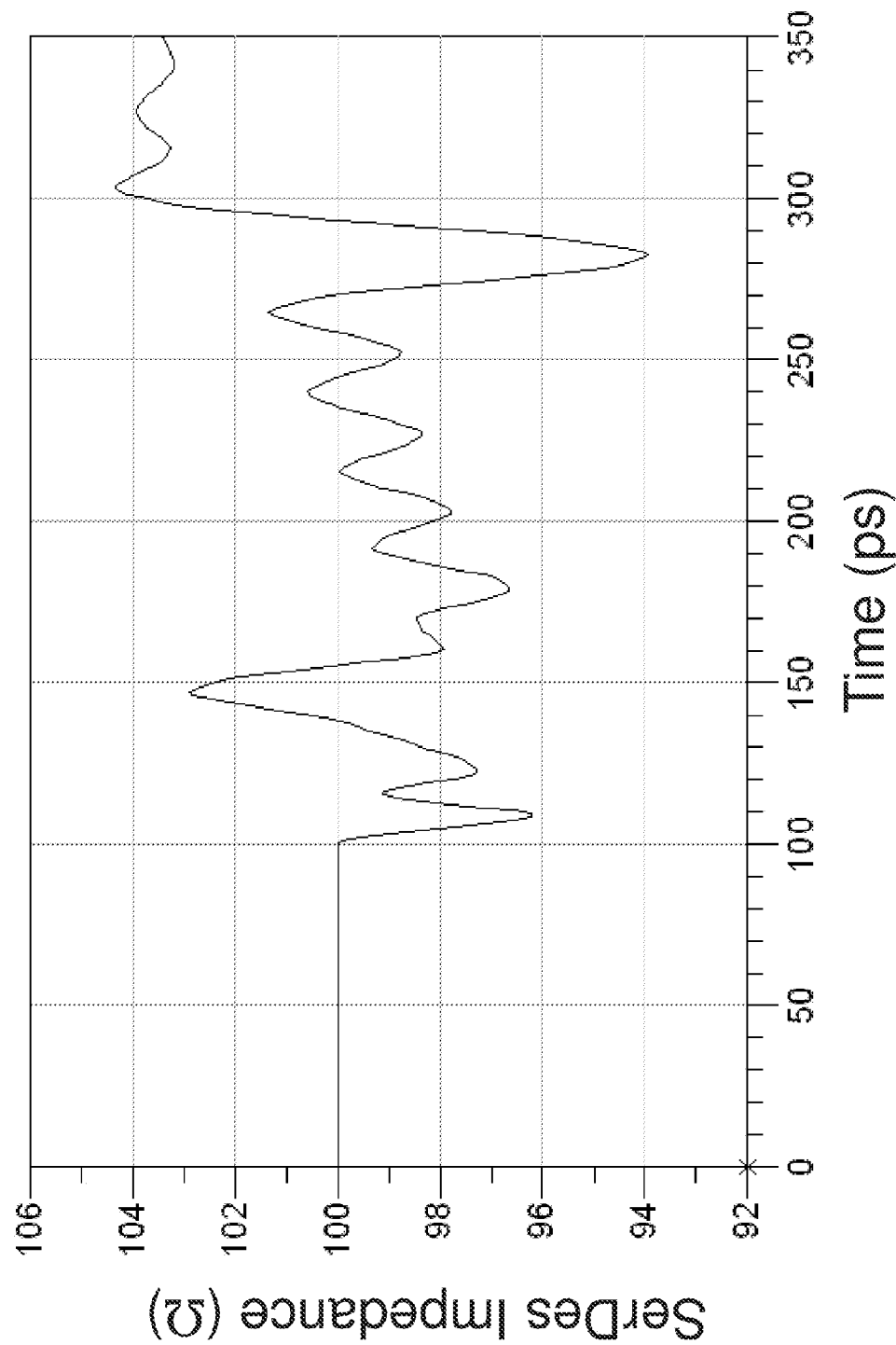
FIG. 7 shows the SerDes differential impedance in the first embodiment after 3D model extraction and TDR analysis.

FIG. 7 is a TDR plot of the SerDes differential impedance for the first embodiment. The model was extracted with a 3D electromagnetic field solver, HFSS (High Frequency Structure Simulator). To accommodate for 25 Gb/s data rate, the TDR rise time was set to be 8 ps. It can be seen from the graph that after impedance optimization for BGA ball, vias below PTH, PTH, vias above PTH, trace fan-out segment connected to via, and all the voids on each layer, the SerDes signal's differential impedance is controlled to 96 to 103 ohms, a variation of <5%. In FIG. 7, the first peak at about 110 ps is the BGA ball impedance. It is optimized to be higher than 96 Ohms. The second peak at about 150 ps is more related to the PTH impedance. It is controlled to be lower than 103 Ohms. Effects for vias below and above the PTH as well as the voids on each layer help manage the impedance in between.

Figures 8A, 8B:
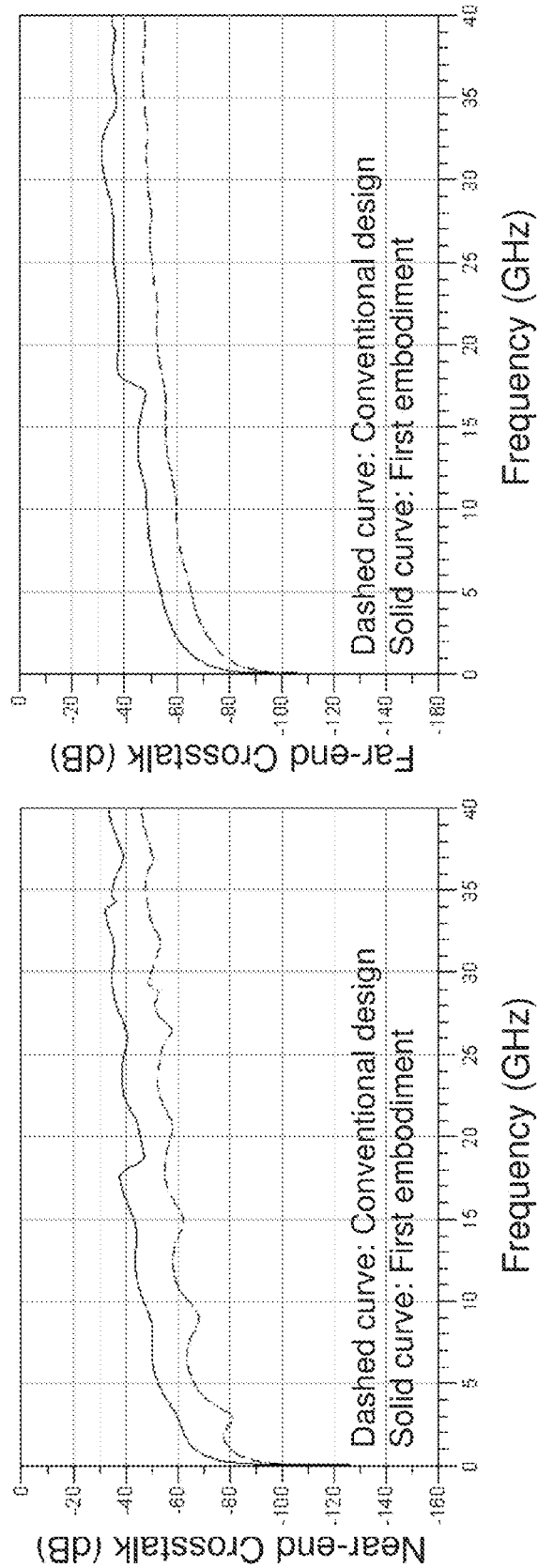
FIGS. 8a-8b show the near-end crosstalk and the far-end crosstalk of the first embodiment and comparison to those of a conventional design.

FIGS. 8a-8b show the near-end and the far-end crosstalk of two adjacent SerDes differential signal pairs for a conventional design (dashed curve) and for the design of the first embodiment after impedance optimization (solid curve). FIGS. 8a and 8b are for the SerDes differential mode at the bump side and the ball side, respectively. The impact to crosstalk is still minimal for the design of the first embodiment after optimization even though large voids were created on each metal layer below layer 3. For the first embodiment, both crosstalk values were <−30 dB from DC to 40 GHz. Total crosstalk to a SerDes differential pair should be less than −25 dB. Thus, it can be seen that excessive crosstalk is not present in the design of the first embodiment.

Figure 9A:
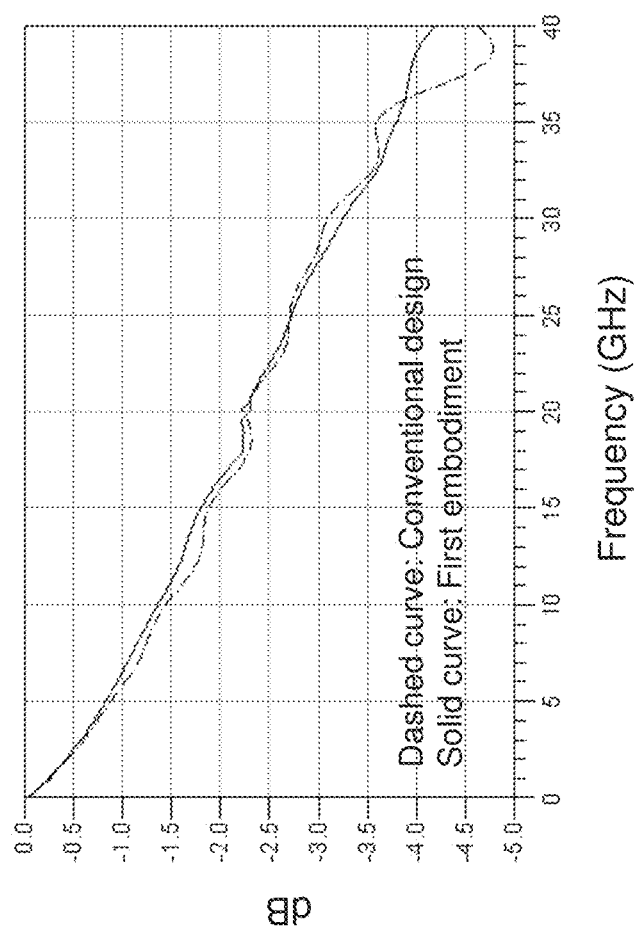
FIGS. 9a-9e show the insertion loss and the return loss of the first embodiment and comparison to those of a conventional design.
Figure 9C:
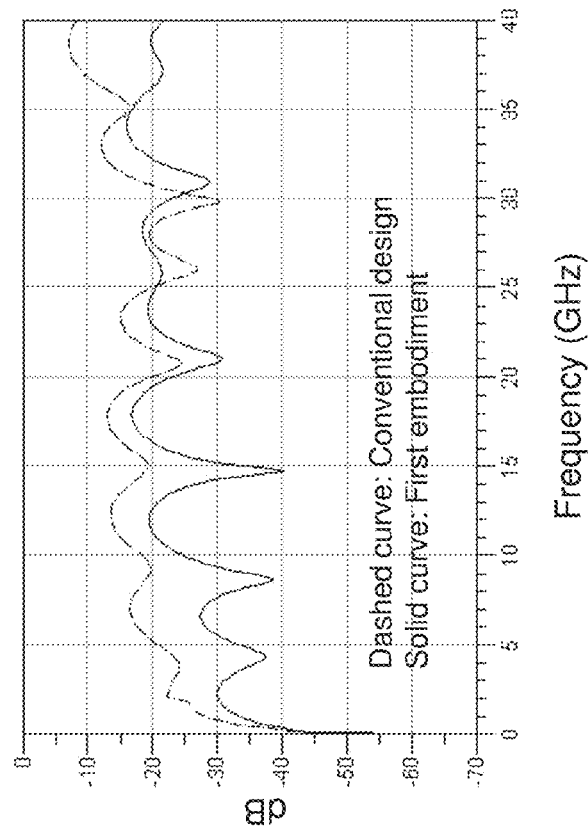
Figure 9B:
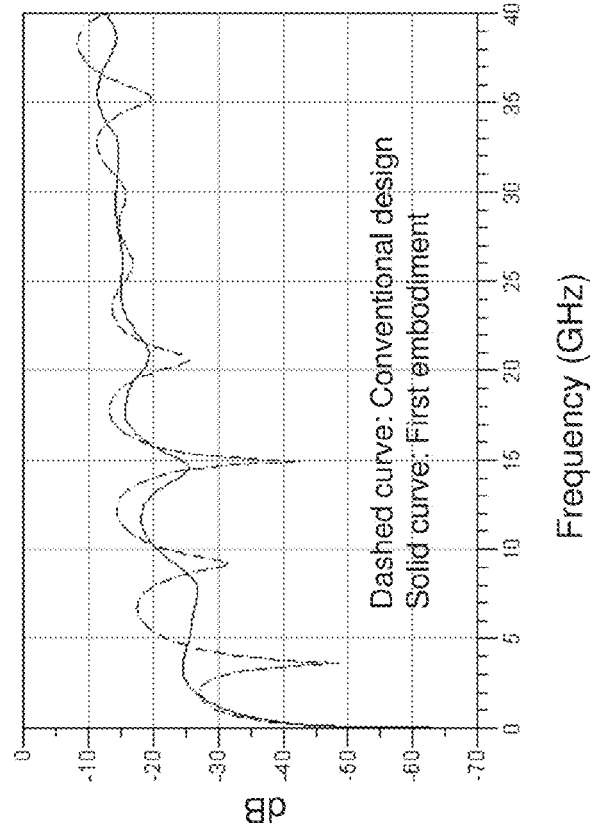
Figure 9E:
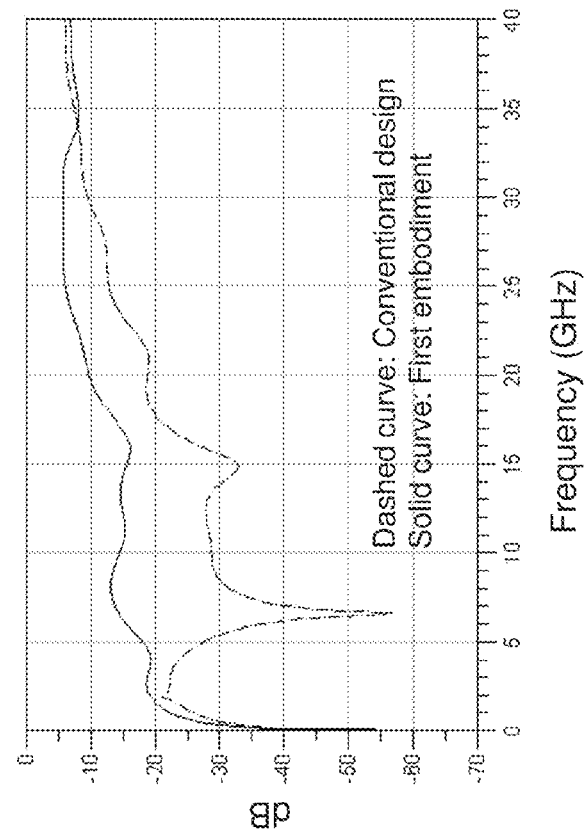
Figure 9D:
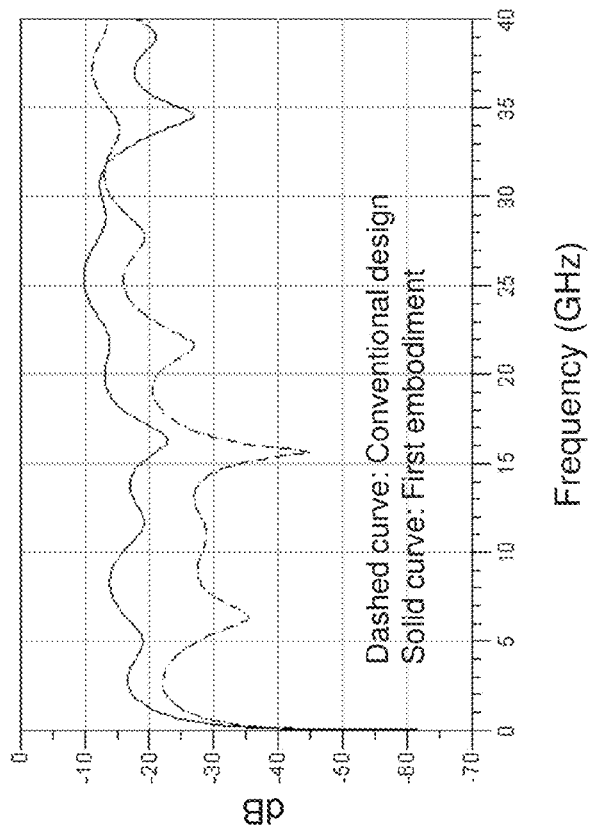

FIGS. 9a-9e show the insertion loss and the return loss of the SerDes differential signal for a conventional design (dashed curves) and for the design of the first embodiment after impedance optimization (solid curves). FIG. 9a shows the differential mode insertion loss. FIGS. 9b and 9c show the differential mode return loss at the bump side and the ball side, respectively. FIGS. 9d and 9e show the common mode return loss at the bump side and at the ball side, respectively. For the insertion loss, the optimization in the first embodiment had little impact. For the differential mode return loss, it became lower than −10 dB across the entire frequency spectrum from DC to 40 GHz after optimization (first embodiment). For the common mode return loss, it was still lower than −5 dB from DC to 40 GHz after optimization (first embodiment). The electrical simulation results in FIGS. 8a-8b and FIGS. 9a-9e show that the there should be no concern that larger ground voids on each layer would lead to poor crosstalk and signal performance.

FIGS. 10a-10d illustrate the SerDes differential pair design according to a second embodiment of the present invention. To make the drawing easy to view, only the SerDes pair is shown; all its surrounding BGA landing pads, vias, PTHs, voids, and shielding are removed. FIG. 10a is a top view. FIG. 10b is a perspective view. FIG. 10c is a side view in a direction from the lower side of FIG. 10a and FIG. 10d is a side view in a direction from the right side of FIG. 10a.

As shown in FIG. 10a, a key difference between this design of the second embodiment and the design of the first embodiment is the "90 degree rotation" of the vertical plane that passes through the PTH 101 pair (and all the vias 102 above them on the upper side of the PTH) relative to the vertical plane that passes through the corresponding BGA ball pads 103. Also, the PTH 101 pair and the vias 102 above them are located at the center plane between the two BGA ball pads 103 and are kept equal distance to each of the two ball pads; the vias 104 below the PTHs 101 are located in the vertical plane through the two BGA ball pads 103 (so each PTHs 101 is also at equal distance to the two vias 104). Note here that the locations of the various components such as PTH, pad, etc. refer to the locations of their center or center line. This arrangement minimized the electromagnetic field coupling for vertical interconnections between everything below the bottom side of the PTH and everything above the bottom side of the PTH. This is because the electrical field of the PTHs is perpendicular to the electrical field of the BGA balls.

FIGS. 10a-10d also show the BGA pad to via pad connections 105, lower-side via to PTH connections 106, and SerDes differential traces 107.

One of the major challenges in the second embodiment is the enlargement of the BGA ball size due to the increase of BGA ball pitch. As shown in the table in FIG. 11, which shows a comparison of package layout parameters between the first embodiment (column labeled "1") and the second embodiment (column labeled "2"), from a 0.8 mm BGA ball pitch to a 1 mm BGA ball pitch the BGA ball height and width after reflow have increased from 0.35 mm and 0.40 mm to 0.40 mm and 0.50 mm respectively. This change dramatically increased the capacitive coupling between the two SerDes signals and pushed down the impedance of the BGA balls. As a result, the design in the first embodiment would not work for the second embodiment anymore. The "90 degree rotation" of the PTH and vias above it helps to bring up the BGA ball impedance. It also made the impedance optimization work easy when varying the pitches of the vias below the PTH, the PTH, and the via above the PTH because of the electrical field decoupling effect.

Another major difference between the first embodiment and the second embodiment is the spacing between the vias of the SerDes pair and between the PTHs of the SerDes pair. The first embodiment uses a single spacing of 550 µm for the PTHs and for the vias both above and below the PTHs. In the second embodiment the via spacing below the PTH is 280 µm and the via spacing above the PTH and the PTH spacing are 500 µm. For ground balls around the SerDes signal balls, the second embodiment only needs one ground ball adjacent to one of its two signal balls. The ground void design below the PTH for the first and second embodiments is the same. A 50 µm ground trace is used to connect all the ground BGA ball pads in the second embodiment, similar to the first embodiment. A similar design with an enlarged antipad for each layer up to layer 3 above the PTH as in the first embodiment applies to the second embodiment as well. It should be noted that because there may be other SerDes traces routed near the SerDes pair, the antipad size may have to be adjusted to avoid ground void for other traces. On trace routing layer 2, similar to the first embodiment, trace shielding is used. Because of the difference of dielectric layer thickness because the two embodiments, the second embodiment employs the following design rules: trace width=25 µm, trace spacing=60 µm, and trace to shielding spacing=75 µm. Layer 1 has a ground plane.

Figure 12:
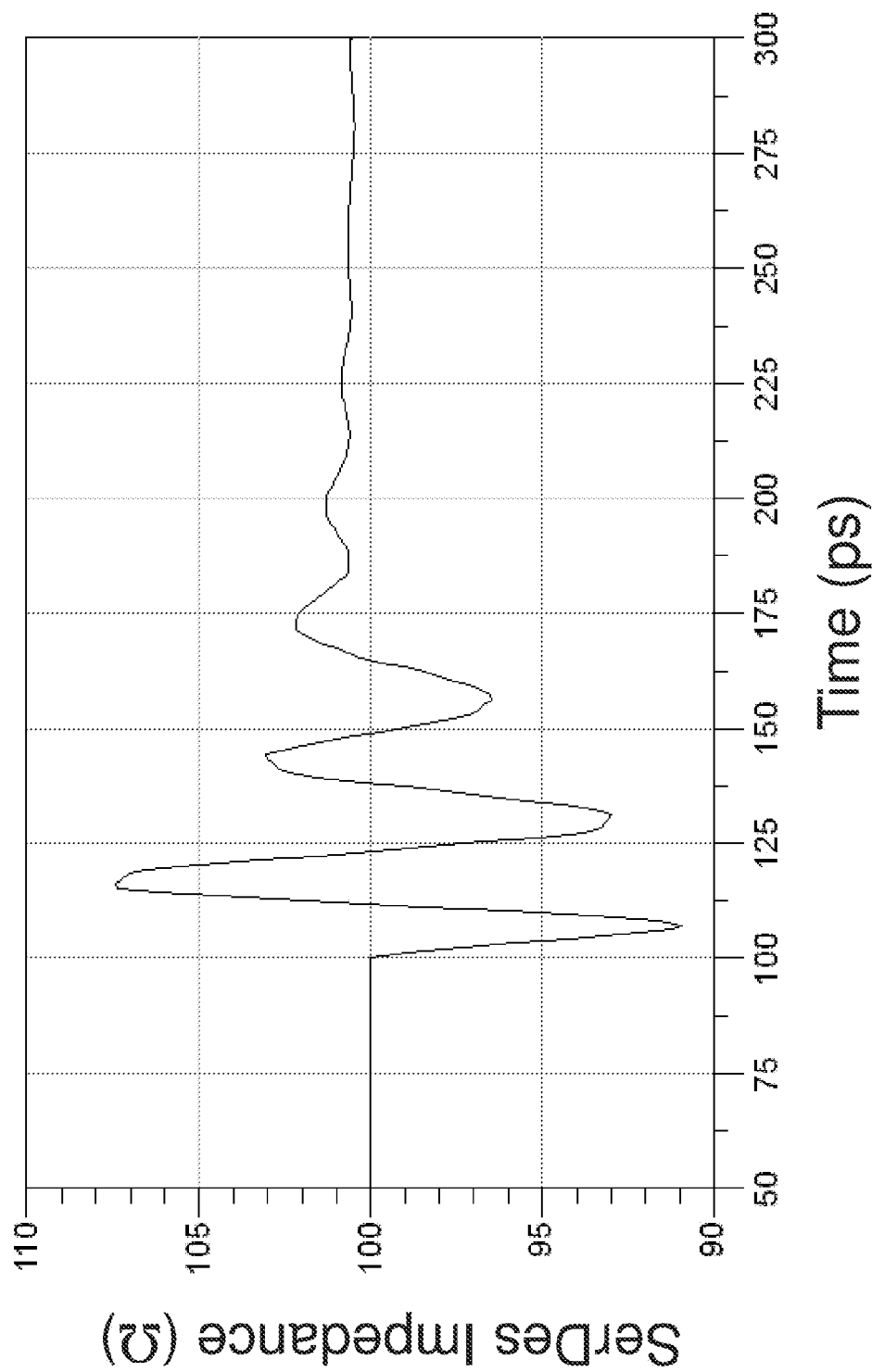
FIG. 12 shows the SerDes differential impedance in the second embodiment using 3D model extraction and TDR analysis.

FIG. 12 shows the SerDes differential impedance for the second embodiment. It is optimized to be <10% variation from 100-Ohm nominal differential impedance even if the rise time is only 8 ps. This package design is suitable for SerDes signals over 25 Gb/s. The 1 mm BGA ball pitch and the 6-2-6 layer stackup allow the package to be used for high pin count applications. C4 bump and its via were not included in the modeling.

It should be noted that although the disclosure is targeted for signal transmission rate at 25 Gb/s and over, it can be used for data rate less than 25 Gb/s. In this case, longer transmission distance, better eye diagram, and reduced BER (Bit Error Rate) are expected. Although the disclosure used two common package layer counts and BGA ball pitches as examples to illustrate the design, the method is applicable to all BGA package designs for high speed SerDes applications.

It should be noted that all parameter values given in this disclosure are approximate values, and other suitable values may be used.

The two embodiments discussed above are two common cases. In practice, there are many different cases for a package substrate design. The diversity comes from variations of the following package design parameters: package substrate layer count, stripline or microstripline of the SerDes signal, build-up dielectric layer thickness and its electrical property (dielectric constant and loss tangent), core dielectric layer thickness and its electrical property (dielectric constant and loss tangent), metal layer thickness, BGA ball height and diameter after reflow, BGA ball spacing of the SerDes signal pair, the ground BGA ball assignment/pattern around the SerDes signal pair, C4 bump height and diameter after reflow, C4 bump spacing of the SerDes signal pair, the ground C4 bump assignment/pattern around the SerDes signal pair, etc.

According to one aspect of the present invention, once a package design condition (all of the parameters mentioned in the previous paragraph) is defined, the following parameters may be used in differential impedance optimization for the vertical interconnection of a SerDes signal pair: via to via spacing below the core layer, PTH to PTH spacing in the core layer, rotation of the PTH-to-PTH plane with respect to the BGA-ball-to-BGA-ball plane (90 degrees or 0 degree, or other angles), via to via spacing above the core layer, and width and length of initial trace segment which connects the top via to the horizontal trace. Here via to via spacing is a controllable parameter because all vias below the core layer are stacked and centered and all vias above the core layer are also stacked and centered. Spiraled vias or randomly stacked vias are not recommended because their optimization is harder to implement. Also, stacked via arrangement is high volume manufacturable (6 stacked vias maximum as of today, and the allowable number of stacked vias expanding) and can achieve the ±10% differential impedance variation. It should be noted that, no matter what the via stacking arrangement is, the via to via spacing from one SerDes signal to another SerDes signal is a key parameter for differential impedance optimization. The via diameter or its landing pad diameter can also be changed to tune the differential impedance, but this optimization process might be more time consuming.

After a package layout is completed, differential impedance optimization for the SerDes vertical interconnections can be carried out. At this point, the package design condition as mentioned in the previous paragraph such as layer stackup, package body size, BGA ball pitch and the SerDes signals' C4 bump and BGA ball locations has been decided. As initial values in the optimization process, the structures and their parameters values for via, PTH, and void provided in the first and second embodiments described above may be used, or other initial values may be used as well. Ansys 3D full-wave electromagnetic (EM) simulation tool HFSS (High Frequency Structural Simulator) or a similar tool may be used as the simulation tool. After the EM simulation, the extracted S-parameter is turned into a TDR plot. Rise time may be set to 8 ps or to a value based on the actual rise time of the SerDes signal. The TDR plot is preferably based on raw data without data point smoothing. In the graph the differential impedance is plotted from the BGA ball to the C4 bump which is terminated to a 100-ohm differential resistor.

Typically, the first peak in the graph is mainly caused by the BGA ball. Because the BGA ball is large, its capacitance is large. This results in the differential impedance of the first peak much lower than the desired differential impedance. The second peak is mainly caused by the PTH. Its value may be higher or lower than the desired differential impedance. The third peak is mainly caused by the vias above the PTH and the initial fan-out trace segment. The vias below the PTH affects the first peak and the second peak in a less significant way. Knowing which physical structure is the main contributor to a specific peak, the value of a peak can be raised or lowered by adjusting the spacing of the corresponding physical structure.

It should be noted that a peak's value is not solely determined by the corresponding physical structure. In fact, its neighboring physical structures' contribution cannot be neglected if the impedance discontinuity at the interface is large and therefore the reflection is not negligible. This is because the impedance is determined by dividing the total voltage by the total current. It is understood that the total voltage or the total current at a particular point is a vector summation of all the waves passing through that point. For a non-uniform differential impedance system, reflected waves from each impedance discontinuity interface contribute to the total voltage and current. Their impact on the differential impedance needs to be considered. Because of this the TDR impedance optimization may take several iterations. For example, the inventor has observed the impact of C4 bump dimension to the first peak during simulations. Although it is small, it cannot be neglected.

Figure 13:
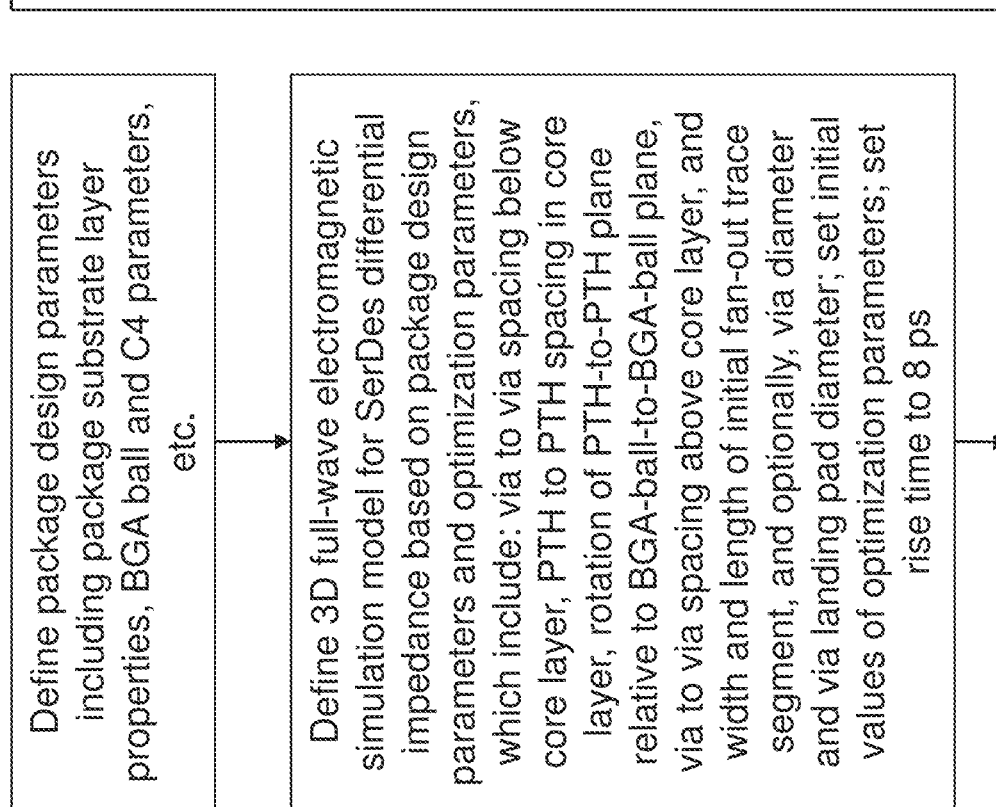
FIG. 13 schematically illustrates an optimization method for determining optimum parameter values for the flip-chip package.

In one implementation of the optimization procedure, the differential impedance value of the first peak is first tuned to be within +10% of the desired differential impedance. Then the second peak value is tuned. During the tuning process for the first peak, the second peak's value may become worse; this is acceptable as the second peak's value will be adjusted later on. Similarly, when tuning the second peak, the third peak's value may become worse, but its optimization can be left to the next stage. The process may be repeated. After a few iterations, the overall impedance curve can be within +10% of the desired differential impedance. The optimization procedure is summarized in FIG. 13.

In summary, embodiments of the present invention provide vertical interconnection structures that employ BGA/via/PTH in an organic package substrate, where, by controlling various parameters, the SerDes differential impedance can be optimized for signals of 25 Gb/s and beyond. In one aspect, the invention is directed to vertical interconnection structures that have certain structural features, which permit controlling of their parameters for SerDes differential impedance optimization. In another aspect, the invention is directed an optimization method that optimizes SerDes differential impedance by controlling various structural parameters of the vertical interconnection structures.

The structural features that are different form conventional package designs and that can be used for optimization are summarized below.

Via structure and via spacing: In conventional packages, the main requirement in via design is to achieve the vertical interconnection from BGA pad to C4 bump pad while meeting the design rules. Traditionally, due to practical concerns such as mechanical stress etc., stacked vias beyond two to three layers was not used. With the advancement of substrate manufacturing technology in recent years, stacking several vias becomes doable for high volume manufacturing. Implementations of the present invention use a simple via structure, where all the vias are stacked and centered both below and above the PTH. While such vertical stacking via structure is not new (it is favored in some designs because it eliminates the need for horizontal traces connecting vias from adjacent layers), controlling the via spacing for optimization purpose has not been done before. In embodiments of the present invention, using such a stacked via structure, via spacing between a SerDes' positive signal and negative signal is a parameter that is tuned in the SerDes TDR differential impedance optimization process.

PTH structure and PTH spacing: In conventional packages, the PTH spacing and the direction of the vertical PTH plane (passing through the two vertical PTHs of a SerDes signal pair) with respect to the vertical BGA ball plane (passing through the two BGA balls of the same SerDes signal pair) are not used to optimize impedance. For ease of layout, these two planes are typically in the same direction, but are typically not merged into one plane, meaning the two PTHs are not on the center line across the two BGA balls centers. No conventional designs have adopted the perpendicular direction of the PTH plane with respect to the BGA ball plane. In embodiments of the present invention, the PTH spacing is used as a parameter to optimize the SerDes TDR differential impedance. If the BGA ball dimension is small as is the case in the first embodiment for the 0.8 mm BGA ball pitch and if the BGA ball differential impedance is within the design range, then the PTH plane and the BGA ball plane can be merged into one plane. If the BGA ball dimension is large as is the case in the second embodiment for the 1 mm BGA ball pitch and if the BGA ball differential impedance is below the design range, then the 90 degree PTH plane orientation is desired. In this situation the two PTHs are kept at an equal distance away from the two BGA ball centers. The orientation angle can also be used as a parameter to fine tune the SerDes TDR differential impedance.

Fan-out trace. In conventional packages, the initial trace segment connecting the via to the horizontal parallel differential trace has the same trace width as the rest of the parallel differential trace. If the trace is routed from the C4 bump to the BGA ball, this trace segment is called the fan-out trace. In embodiments of the present invention, the trace width and length of an initial segment of the fan-out traces are fine tuned to optimize the SerDes TDR differential impedance. Because of the larger spacing between the initial segments of the two fan-out traces, widening the trace width from the via to a certain distance is helpful to smooth the impedance.

Ground plane void and antipad enlargement. In conventional packages, for layers below the PTH, the ground planes are not provided with large voids; only antipads are used. As understood by those skilled in the relevant art, antipads typically have a round shape around the vias. In some conventional packages, in layers above the PTH, the antipad is enlarged, but the enlarged amount is often arbitrary. In embodiments of the present invention, most planes above the PTH (including the top PTH layer) are provided with large voids that are substantially larger than conventional antipads. As long as the nearby routing signals have a ground or power return-path plane, it is preferable to maximize the void size. Below the PTH (including the bottom PTH layer), most layers are almost completely free of the ground plane, with only a 50 um metal trace used as the shielding on each layer. The trace is also a path that provides the ground return current. Here the 50 um width can be made a little wider or narrower. It is a fine tuning parameter for impedance.

Some other parameters are not used in the above-described optimization process, but in implementations of the present invention their values may be different from those commonly used in conventional package designs to improve SerDes differential impedance. The considerations and preferred ranges for some of these other design parameters are discussed below.

Note that conventional package designs typically follow the JEDEC (Joint Electron Device Engineering Council) standard for BGA ball pitch. The standard is 1.27 mm, 1 mm, 0.8 mm or 0.65 mm et al. Sometimes a conventional package may have several different BGA ball pitches in different locations of the package. For example, if routed diagonally for a 0.8 mm BGA ball pitch package, a SerDes pair's BGA ball pitch will become 1.13 mm (0.8×1.414). The first and second embodiment discussed above, as well as the discussion below, focus on two most commonly used BGA ball pitches, i.e., 0.8 mm and 1 mm, but the principle applicable to other pitches as well.

BGA ball height, size, pad: For 0.8 mm BGA ball pitch packages, 0.5 mm or 0.6 mm diameter BGA balls (before reflow) have been conventionally used. For the 1 mm BGA ball pitch, 0.6 mm or 0.63 mm diameter BGA balls (before reflow) have been conventionally used. In various implementation of the present invention, smaller BGA balls are used to lower capacitive coupling, specifically, 0.5 mm and 0.6 mm balls for the 0.8 mm pitch and 1 mm pitch, respectively.

In conventional designs there are no strict requirements for BGA ball height and diameter after reflow. In conventional packages, for the 0.8 mm pitch and 0.5 mm diameter before reflow, the ball height or stand off after reflow ranges from 0.3 mm to 0.5 mm and the ball diameter after reflow ranges from 0.4 mm to 0.6 mm. The inventor discovered that smaller BGA balls are more desirable for the purpose of reducing capacitive coupling between the two SerDes BGA balls, leading to increased BGA ball differential impedance closer to 100 ohms. Thus, in embodiments of the present invention, the BGA ball height is controlled to be about 0.35 mm and the BGA ball diameter is about 0.4 mm after reflow. For this purpose, smaller diameter BGA balls before reflow are used. In assembly the 0.5 mm ball may be too large and an even smaller diameter ball such as 0.4 mm may be needed. Also, in PCB assembly the solder paste material thickness may have to be reduced to achieve the required 0.35 mm stand off and the 0.4 mm after-reflow diameter.

Similarly, in conventional packages, for the 1 mm pitch and 0.6 mm diameter before reflow, the ball height or stand off after reflow ranges from 0.4 mm to 0.6 mm and the ball diameter after reflow ranges from 0.5 mm to 0.7 mm. In implementations of the present invention, 0.4 mm height and 0.5 mm diameter after reflow are used; to reduce capacitive coupling, the smaller diameter BGA ball before reflow are used. In assembly the 0.6 mm ball may be too large and an even smaller diameter ball such as 0.5 mm may be needed. Also, in PCB assembly the solder paste material thickness may have to be reduced to achieve the required 0.4 mm stand off and the 0.5 mm after-reflow diameter.

On the other hand, the BGA ball height and diameter after reflow cannot be too small. Because due to the CTE (Coefficient of Thermal Expansion) mismatch of different package material, a package is typically warped. On the other hand, the PCB is relatively flat because the board is thicker and its material is harder. Soldering a warped package on a flat surface requires that the BGA ball height and diameter cannot be too small. Otherwise, there might be reliability issues due to stress and cracking. Therefore, the BGA ball size as discussed above in implementation of the present invention is the result of various competing considerations including impedance optimization and practical considerations; these values are recommended as they are practical in fabrication and are the smallest values currently permitted by manufacturers. However, the invention is not limited to these particular BGA ball sizes.

The BGA ball landing pad diameter is usually 100 um larger than the BGA ball pad opening. Too large a diameter will increase capacitive coupling; too small a diameter will create an alignment issue in high volume manufacturing.

Ground BGA balls: In conventional designs, ground BGA ball sites around a SerDes pair are always fully populated, as it is generally believed they help to shield the SerDes signals and in turn lower crosstalk among adjacent SerDes signals. However, the impact of excessive ground BGA balls on differential impedance has been ignored in conventional designs. In implementations of the present invention, only one ground BGA ball around a SerDes pair is necessary to provide a ground path for return current. As a result, crosstalk is acceptable and differential impedance can be dramatically improved.

Via diameter and via pad: Standard via diameter of 60 um and via pad of 100 um may be used in embodiments of the present invention, but larger via diameter and via pad are also possible. In the optimization process in some implementations of the present invention, these two parameters are not used as tuning parameters because changing the via to via spacing is sufficiently effective for optimization, and tuning these two parameters requires more work in layout for optimization. In other implementations, these two parameters may be used as tuning parameters for optimization.

PTH diameter and PTH pad: Standard PTH diameter of 150 um and PTH pad of 300 um may be used in embodiments of the present invention, but larger PTH diameter and PTH pad are also possible. For one substrate manufacturer, 250 um PTH pad is standard. In implementations of the present invention, 150 um for PTH diameter and 300 um for PTH pad may be used. In the optimization process in some implementations of the present invention, these two parameters are not used as tuning parameters because changing the PTH to PTH spacing is sufficiently effective for optimization, and tuning these two parameters requires more work in layout for optimization. In other implementations, these two parameters may be used as tuning parameters for optimization.

It will be apparent to those skilled in the art that various modification and variations can be made in the chip package design and design method of the present invention without departing from the spirit or scope of the invention. Thus, it is intended that the present invention cover modifications and variations that come within the scope of the appended claims and their equivalents.

What is claimed is:

1. A semiconductor chip package for high speed SerDes signals, comprising:

a plurality of substrate layers stacked on each other, including a top layer, a first subset of multiple layers stacked on each other and below the top layer, a second subset of one or more layers stacked on each other and below the first subset, and a third subset of multiple layers stacked on each other and below the second subset, wherein each of the first subset of multiple layers includes at least first and second front-side vias adjacent each other, the first front-side vias of the multiple layers being stacked and centered with each other to form a first front-side via stack, and the second front-side vias of the multiple layers being stacked and centered with each other to form a second front-side via stack, wherein the first and second front-side via stacks are separated by a predetermined first distance, wherein each of the second subset of one or more layers includes at least first and second plated-through-holes (PTHs) adjacent each other, the first PTHs of the one or more layers being stacked and centered with each other to form a first PTH stack and the second PTHs of the one or more layers being stacked and centered with each other to form a second PTH stack, wherein the first and second PTH stacks are separated by a predetermined second distance, wherein each of the third subset of multiple layers includes at least first and second back-side vias adjacent each other, the first back-side vias of the multiple layers being stacked and centered with each other to form a first back-side via stack, and the second back-side vias of the multiple layers being stacked and centered with each other to form a second back-side via stack, wherein the first and second back-side via stacks are separated by a predetermined third distance, wherein either the first front-side via stack or the first back-side via stack or both are stacked and centered with the first PTH stack, and either the second front-side via stack or the second back-side via stack or both are stacked and centered with the second PTH stack, wherein the top layer includes first and second vias, wherein a top one of the first subset of layers includes at least first and second metal traces respectively connecting the first and second vias of the top layer with the first and second vias of the top one of the first subset of layers, the first and second metal traces each including an initial segment respectively leading from the first and second vias of the top one of the first subset of layers, the initial segments having a predetermined length and a predetermined width which is different from a width of remaining portions of the first and second metal traces;

wherein each of the top one and a second one of the first subset of layers has a metal ground plane with an antipad around the first and second vias, wherein each of remaining ones of the first subset of multiple layers has a metal ground plane with a ground void around the first and second vias having a size greater than that of the antipad, and wherein each of the third subset of multiple layers is free of a metal ground plane;

at least a first and a second silicon die bumps (C4 bumps) formed on the top layer and connected to the first and second vias of the top layer, for flip-chip mounting a semiconductor chip;

a plurality of ball grid array (BGA) ball landing pads formed on a bottom side of a bottom one of the third subset of multiple layers, the BGA ball landing pads forming a grid; and at least a first and a second BGA balls formed on two of the BGA ball landing pads and connected to the first and second back-side via stacks, wherein the first BGA ball, the first back-side via stack, the first PTH stack, the first front-side via stack, the first metal trace, the first via of the top layer, and the first C4 bump are electrically connected together, and wherein the second back-side via stack, the second PTH stack, the second front-side via stack, the second metal trace, the second via of the top layer, and the second C4 bump are electrically connected together, wherein a SerDes signal differential impedance from the first and second BGA balls to the corresponding first and second C4 bumps has a variation of less than 10% in a time domain for a signal with a 25 Gb/s or higher data rate.

2. The semiconductor chip package of claim 1, wherein both the first front-side via stack and the first back-side via stack are stacked and centered with the first PTH stack, and both the second front-side via stack and the second back-side via stack are stacked and centered with the second PTH stack.

3. The semiconductor chip package of claim 2, wherein the grid has a pitch of about 0.8 mm, and wherein the predetermined first distance between the first and second front-side via stacks, the predetermined second distance between the first and second PTH stacks, and the predetermined third distance between the first and second back-side via stacks are about 0.55 mm.

4. The semiconductor chip package of claim 3, wherein the first and second BGA balls have a diameter of about 0.5 mm before reflow, and a height of 0.3 mm to 0.5 mm and a diameter of 0.4 mm to 0.6 mm after reflow.

5. The semiconductor chip package of claim 1, wherein the first front-side via stack is stacked and centered with the first PTH stack, and the second front-side via stack is stacked and centered with the second PTH stack,
wherein a plane passing through centers of the first and second PTH stacks and a plane passing through centers of the first and second back-side via stacks are non-parallel to each other.

6. The semiconductor chip package of claim 5, wherein the plane passing through the centers of the first and second PTH stacks and the plane passing through the centers of the first and second back-side via stacks are perpendicular to each other, and each of the first and second PTH stacks are located at equal distance to the first and second back-side via stacks.

7. The semiconductor chip package of claim 5, wherein the grid has a pitch of about 1.0 mm, wherein the predetermined first distance between the first and second front-side via stacks and the predetermined second distance between the first and second PTH stacks are about 0.5 mm, and the predetermined third distance between the first and second back-side via stacks are about 0.28 mm.

8. The semiconductor chip package of claim 7, wherein the first and second BGA balls have a diameter of about 0.6 mm before reflow, and a height of 0.4 mm to 0.6 mm and a diameter of 0.5 mm to 0.7 mm after reflow.

9. The semiconductor chip package of claim 1, wherein the ground voids in the metal ground planes of the remaining ones of the first subset of multiple layers have a rectangular shape and a size of about 1.1 by 1.8 mm, and wherein the antipads in the metal ground plane of the top one and second one of the first subset of layers have a size of about 0.7 by 1.5 mm.

10. The semiconductor chip package of claim 1, wherein each of the first and third subset of multiple layers includes a plurality of ground vias, each of the third subset of multiple layers includes plurality of ground PTHs, the corresponding ground vias and ground PTHs of different layers being stacked and centered with each other and arranged on the grid corresponding to the BGA ball landing pads,
wherein each of the third subset of multiple layers includes metal ground shielding traces connecting adjacent ones of the plurality of ground vias.

11. The semiconductor chip package of claim 1, wherein on the bottom side of the bottom one of the third subset of multiple layers, a majority of the BGA ball landing pads around the first and second BGA balls are unoccupied by BGA balls, and wherein the bottom surface is free of a metal layer and has metal traces connecting adjacent ones of the BGA ball landing pads around the first and second BGA balls.

12. The semiconductor chip package of claim 1, wherein the top layer has a metal ground plane.

13. An optimization method for a semiconductor chip package for high speed SerDes signals, the package comprising:
a plurality of substrate layers stacked on each other, including a top layer, a first subset of multiple layers stacked on each other and below the top layer, a second subset of one or more layers stacked on each other and below the first subset, and a third subset of multiple layers stacked on each other and below the second subset,
wherein each of the first subset of multiple layers includes at least first and second front-side vias adjacent each other, the first front-side vias of the multiple layers being stacked and centered with each other to form a first front-side via stack, and the second front-side vias of the multiple layers being stacked and centered with each other to form a second front-side via stack, wherein the first and second front-side via stacks are separated by a first distance,
wherein each of the second subset of one or more layers includes at least first and second plated-through-holes (PTHs) adjacent each other, the first PTHs of the one or more layers being stacked and centered with each other to form a first PTH stack and the second PTHs of the one or more layers being stacked and centered with each other to form a second PTH stack, wherein the first and second PTH stacks are separated by a second distance,
wherein each of the third subset of multiple layers includes at least first and second back-side vias adjacent each other, the first back-side vias of the multiple layers being stacked and centered with each other to form a first back-side via stack, and the second back-side vias of the multiple layers being stacked and centered with each other to form a second back-side via stack, wherein the first and second back-side via stacks are separated by a third distance,
wherein the top layer includes first and second vias, wherein a top one of the first subset of layers includes at least first and second metal traces respectively connecting the first and second vias of the top layer with the first and second vias of the top one of the first subset of layers, the first and second metal traces each including an initial segment respectively leading from the first and second vias of the top one of the first subset of layers, the initial segments having a length and a width which is different from a width of remaining portions of the first and second metal traces;
wherein each of the top one and a second one of the first subset of layers has a metal ground plane with an antipad around the first and second vias, wherein each of remaining ones of the first subset of multiple layers has a metal ground plane with a ground void around the first and second vias, and wherein each of the third subset of multiple layers is free of a metal ground plane;
at least a first and a second silicon die bumps (C4 bumps) formed on the top layer and connected to the first and second vias of the top layer, for flip-chip mounting a semiconductor chip;
a plurality of ball grid array (BGA) ball landing pads formed on a bottom side of a bottom one of the third subset of multiple layers, the BGA ball landing pads forming a grid; and
at least a first and a second BGA balls formed on two of the BGA ball landing pads and connected to the first and second back-side via stacks,
wherein the first BGA ball, the first back-side via stack, the first PTH stack, the first front-side via stack, the first metal trace, the first via of the top layer, and the first C4 bump are electrically connected together, and wherein the second back-side via stack, the second PTH stack, the second front-side via stack, the second metal trace, the second via of the top layer, and the second C4 bump are electrically connected together,
the optimization method comprising:
defining package design parameters including package substrate layer count, thickness and electrical properties of each substrate layer, metal layer thickness on each substrate layer, BGA ball height and diameter after reflow, BGA ball landing pad spacing, assignment and pattern of BGA ball on BGA ball landing pads, C4 bump height and diameter after reflow, C4 bump spacing, and assignment and pattern of C4 bumps on the top layer;

defining a 3D full-wave electromagnetic simulation model for SerDes differential impedance from the first and second BGA balls to the respective first and second C4 bumps based on the package design parameters and a plurality of optimization parameters, the plurality of optimization parameters including: the first distance between the first and second front-side via stacks, the second distance between the first and second PTH stacks, the third distance between the first and second back-side via stacks, the lengths and widths of the initial segments of the first and second metal traces, and sizes of the ground voids in the metal ground planes of the remaining ones of the first subset of multiple layers;

setting initial values for the plurality of optimization parameters;

calculating the SerDes differential impedance in a time domain using the simulation model, the package design parameters and the plurality of optimization parameters with their initial values; and when the calculated SerDes differential impedance in the time domain has a variation greater than a predetermined percentage, adjusting the optimization parameters, and re-calculating the SerDes differential impedance using the simulation model, the package design parameters and the plurality of optimization parameters with their adjusted values.

14. The method of claim 13, wherein the plurality of optimization parameters further includes: a diameter of the plurality of front-size and back-size vias, and a diameter of via landing pads on the first and third subset of multiple substrate layers.

15. The method of claim 13, wherein the plurality of optimization parameters further includes an angle formed between a plane passing through centers of the first and second PTH stacks and a plane passing through centers of the first and second back-side via stacks.

* * * * *